(12) United States Patent
Park

(10) Patent No.: US 7,989,860 B2
(45) Date of Patent: Aug. 2, 2011

(54) IMAGE SENSOR AND METHOD FOR MANUFACTURING THE SAME

(75) Inventor: Ji-Young Park, Seocho-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 223 days.

(21) Appl. No.: 12/344,442

(22) Filed: Dec. 26, 2008

(65) Prior Publication Data

US 2009/0166787 A1 Jul. 2, 2009

(30) Foreign Application Priority Data

Dec. 27, 2007 (KR) .......................... 10-2007-0139452

(51) Int. Cl.
*H01L 31/062* (2006.01)
*H01L 31/113* (2006.01)
(52) U.S. Cl. ........................................ 257/292; 257/294
(58) Field of Classification Search .......... 257/290–294, 257/431–470, E31.073, E31.127, E27.133
See application file for complete search history.

(56) References Cited

U.S. PATENT DOCUMENTS

| 6,476,374 | B1 | 11/2002 | Kozlowski |
| 2003/0213915 | A1 | 11/2003 | Chao et al. |
| 2004/0041930 | A1* | 3/2004 | Chao et al. ............... 348/294 |
| 2005/0051701 | A1 | 3/2005 | Hong |
| 2006/0214199 | A1* | 9/2006 | Inoue et al. ............. 257/292 |
| 2009/0039397 | A1* | 2/2009 | Chao .......................... 257/233 |

FOREIGN PATENT DOCUMENTS

| KR | 10-2006-0039945 | 5/2006 |
| WO | WO-2007-001146 | 1/2007 |

* cited by examiner

*Primary Examiner* — Cuong Q Nguyen
(74) *Attorney, Agent, or Firm* — Sherr & Vaughn, PLLC

(57) ABSTRACT

An image sensor includes a circuitry, a substrate, an electrical junction region, a high concentration first conduction type region, and a photodiode. The circuitry includes a transistor and is formed on and/or over the substrate. The electrical junction region is formed in one side of the transistor. The high concentration first conduction type region is formed on and/or over the electrical junction region. The photodiode is formed over the circuitry.

8 Claims, 4 Drawing Sheets

IMAGE SENSOR AND METHOD FOR MANUFACTURING THE SAME

Figure 1:
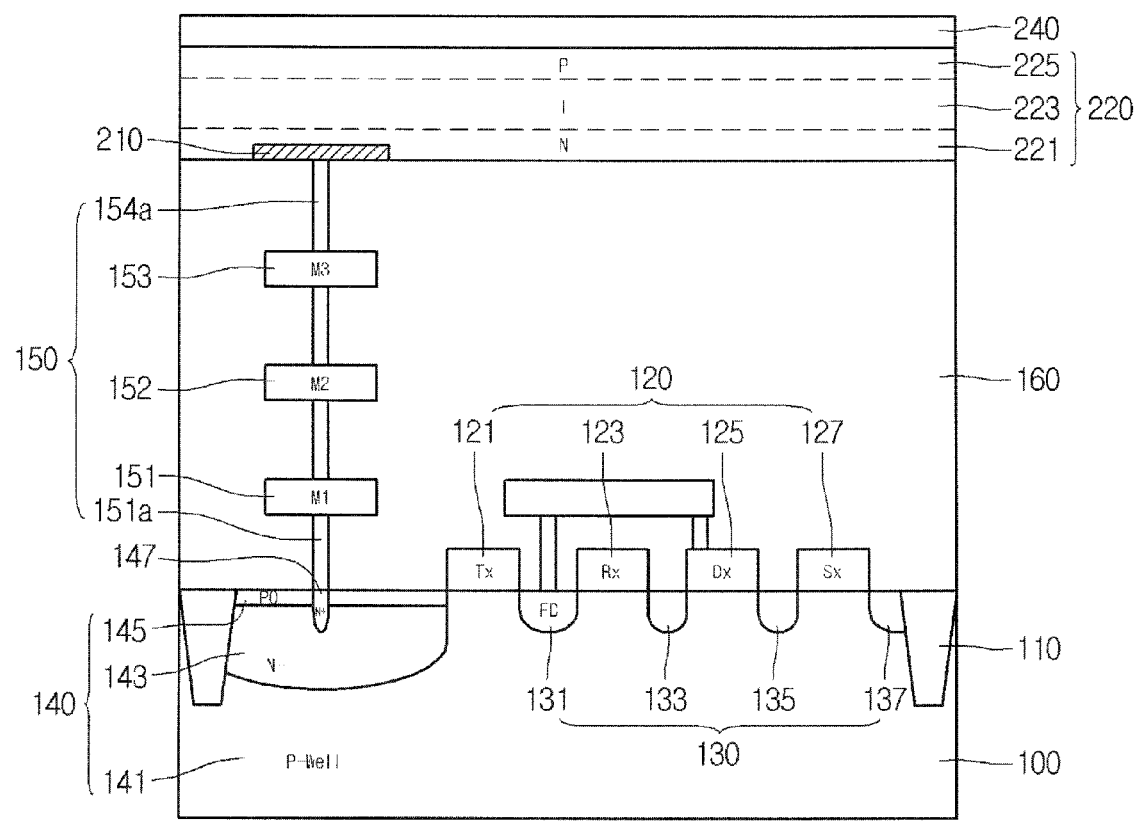

The present application claims priority under 35 U.S.C. § 119 to Korean Patent Application No. 10-2007-0139452 (filed Dec. 27, 2007), which is hereby incorporated by reference in its entirety.

BACKGROUND

An image sensor is a semiconductor device for converting an optical image into an electrical signal. The image sensor may generally be classified as either a charge coupled device (CCD) image sensor or a complementary metal oxide silicon (CMOS) image sensor (CIS).

During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality. Also, because stack height may not reduce as much as the reduction in the area of the light receiving portion, the number of photons incident to the light receiving portion may also be reduced due to diffraction of light, known as "airy disk".

Related image sensors may attempt to form a photodiode using amorphous silicon (Si), or form a readout circuitry in a silicon (Si) substrate using a method such as wafer-to-wafer bonding, and then form a photodiode on and/or over the readout circuitry. The photodiode may then be connected with the readout circuitry through a metal interconnection. Because both the source and the drain on both sides of the transfer transistor may be heavily doped with N-type impurities, a charge sharing phenomenon may occur. When such a charge sharing phenomenon occurs, the sensitivity of an output image may be reduced and an image error may be generated. Also, because a photo charge might not readily move between the photodiode and the readout circuitry, a dark current may be generated and/or saturation and sensitivity may be reduced.

SUMMARY

Embodiments relate to an image sensor and a manufacturing method thereof that provide a new integration of a circuitry and a photodiode. Embodiments relate to an image sensor and a manufacturing method thereof in which a vertical type photodiode may be formed of amorphous semiconductor, and a circuitry efficiently transferring electrons generated in the vertical type photodiode is employed.

Embodiments relate to an image sensor that may includes at least one of the following: a circuitry including a transistor over a substrate; an electrical junction region on one side of the transistor; a high concentration first conduction type region over the electrical junction region; and a photodiode over the circuitry.

Embodiments relate to a method for manufacturing an image sensor that may include at least one of the following: forming a circuitry including a transistor on and/or over a substrate; forming an electrical junction region on one side of the transistor; forming a high concentration first conduction type region on and/or over the electrical junction region; and forming a photodiode on and/or over the circuitry.

DRAWINGS

Figure 2:
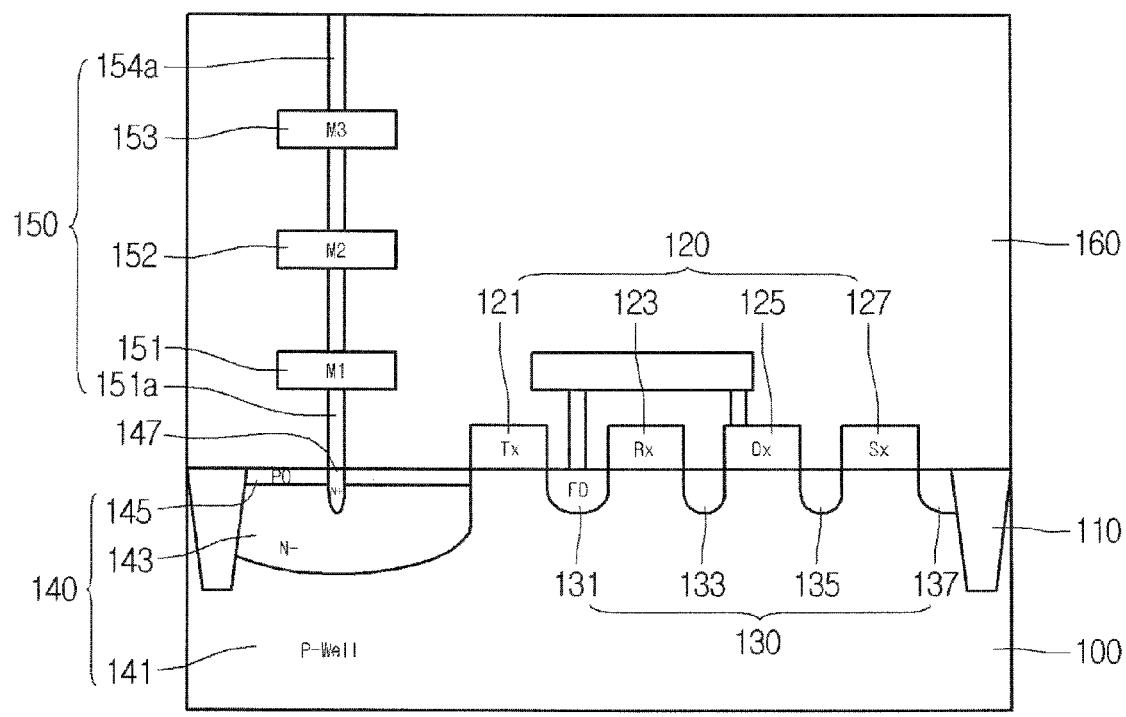
Figure 3:
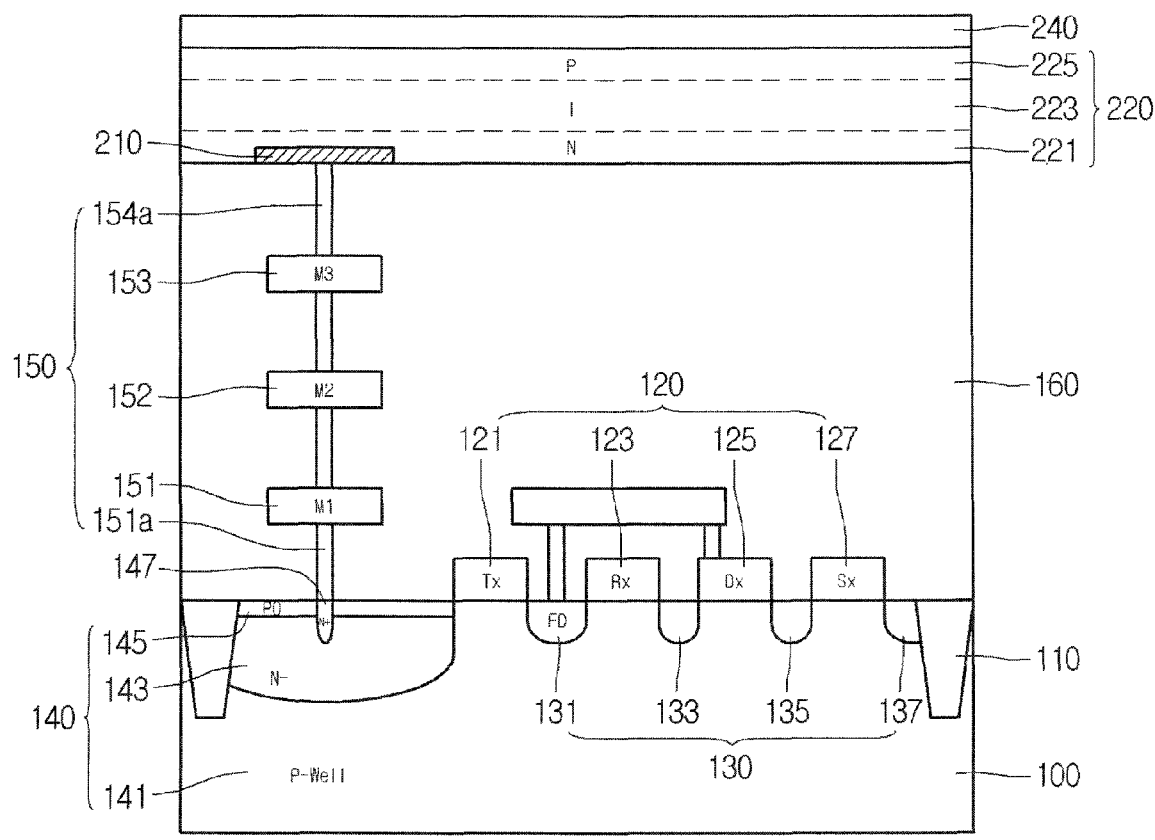

Example FIGS. 1 through 3 illustrates an image sensor and a method for manufacturing an image sensor in accordance with embodiments.

Figure 4:
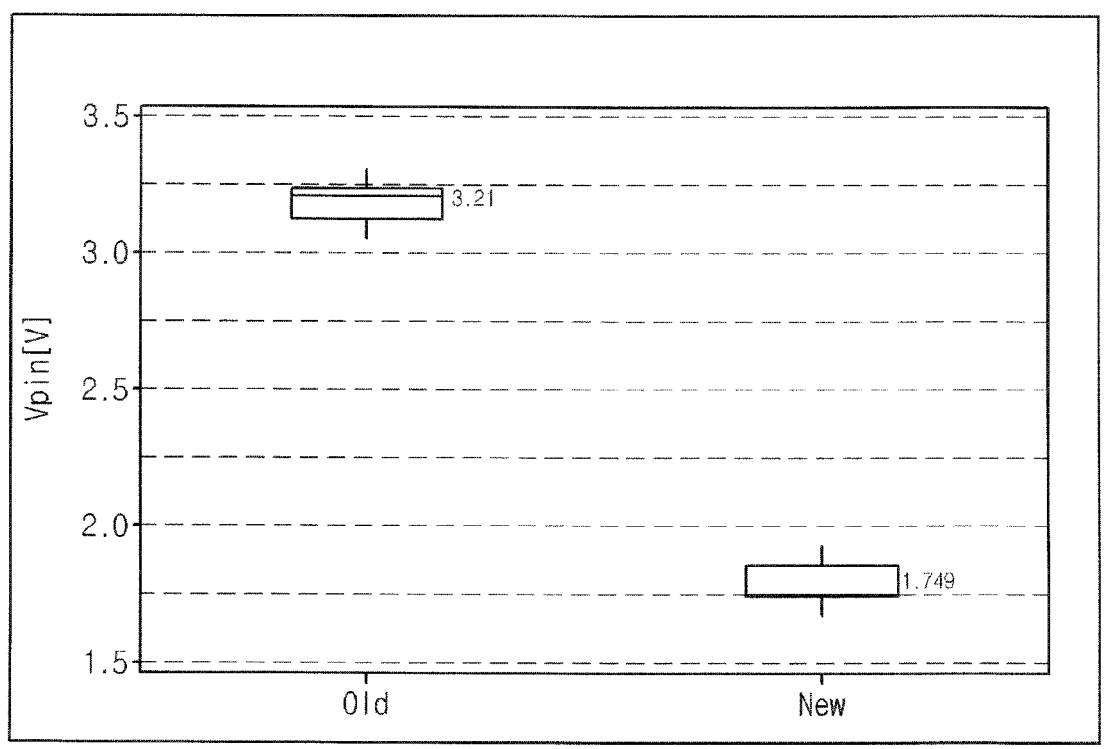

Example FIG. 4 is a graph illustrating effects of an image sensor in accordance with embodiments.

DESCRIPTION

Example FIG. 1 is a sectional view of an image sensor in accordance with embodiments. As illustrated in example FIG. 1, an image sensor may include: a circuitry including transistor 120 over substrate 100; electrical junction region 140 on one side of transistor 120; high concentration first conduction type region 147 over electrical junction region 140; and photodiode 220 over the circuitry. Thus, as illustrated in example FIG. 1, there is vertical integration of the circuitry and the photodiode.

Although embodiments describe a photodiode as being formed using an amorphous layer, the photodiode is not limited thereto but can be formed in a crystalline layer as well. For example, photodiode 220 on and/or over the circuitry may include: an intrinsic layer 223 electrically connected to the circuitry and second conduction type conduction layer 225 on and/or over intrinsic layer 223, but is not limited thereto.

Electrical junction region 140 may be, but is not limited to, a PN junction. For example, electrical junction region 140 may be, but is not limited to, a PNP junction such as a P0 (145)/N−(143)/P−(141) junction. High concentration first conduction type conduction region 147 may be partially formed on and/or over electrical junction region 140 by a plug implant, but is not limited thereto. For example, high concentration first conduction type conduction region 147 may be, but is not limited to, an N+ region partially formed on and/or over electrical junction region 140 by a plug implant through a contact hole.

In accordance with embodiments, a vertical integration of the circuitry and the photodiode can be provided. Also, because electrons generated in a vertical type photodiode are transferred through the electrical junction region, the image quality can be enhanced.

As illustrated in example FIG. 2, a method for manufacturing an image sensor in accordance with embodiments may include preparing a first substrate 100 in which circuitry, including a metal interconnection 150, is formed. The first substrate 100 can be, but is not limited to, a second conduction type substrate. For example, device isolation layer 110 may be formed in the second conduction type first substrate 100 to thereby define an active region. Circuitry including at least one transistor may be formed in the active region. For example, the circuitry may include transfer transistor (Tx) 121, reset transistor (Rx) 123, drive transistor (Dx) 125 and select transistor (Sx) 127. Floating diffusion region (FD) 131 of ion implantation regions 130 including source/drain regions 133, 135, and 137 of respective transistors can then be formed as well.

The forming of the circuitry on and/or over first substrate 100 may include forming an electrical junction region 140 in the first substrate 100 and forming a high concentration first conduction type connection region 147 in an upper portion of the electrical junction region 140 and electrically connected to the metal interconnection 150. Electrical junction region 140 can be, but is not limited to, a PN junction.

For example, electrical junction region 140 can include a first conduction type ion implantation layer 143 formed on and/or over a second conduction type well 141 or a second conduction type epitaxial layer, and second conduction type ion implantation layer 145 formed on and/or over the first conduction type ion implantation layer 143. As illustrated in example FIG. 2, PN junction 140 can be, but is not limited to, a P0 (145)/N−(143)/P−(141) junction.

An interlayer dielectric 160 can be formed on and/or over the first substrate 100. The metal interconnection 150 can then be formed extending through interlayer dielectric 160 and electrically connected to a first conduction type connection region 147. The metal interconnection 150 can include, but is not limited to, a first metal contact 151a, a first metal 151, a second metal 152, a third metal 153 and a fourth metal contact 154a.

As illustrated in example FIG. 3, a photodiode 220 electrically connected to metal interconnection 150 may be formed on and/or over the circuitry. Although embodiments describe the photodiode 220 as being formed in an amorphous layer, the photodiode 220 is not limited thereto but can be formed in a crystalline layer as well.

For example, photodiode 220 may include: an intrinsic layer 223 electrically connected to metal interconnection 150, and a second conduction type conduction layer 225 on and/or over the intrinsic layer 223. In accordance with embodiments, an image sensor may further include a lower electrode 210 connected to the metal interconnection 150. For example, the metal interconnection 150 may further include lower electrode 210 formed of Cr or the like. Alternatively, in accordance with embodiments, an image sensor may further include a first conduction type conduction layer 221 between a lower electrode 210 and an intrinsic layer 223.

A lower electrode 210 may be formed of Cr, or the like, such that the lower electrode 210 contacts, or is electrically coupled with, a fourth metal contact 154a. A first conduction type conduction layer 221 may be formed on, or over, the lower electrode 210. If desirable, a subsequent process may be performed without forming first conduction type conduction layer 221. First conduction type conduction layer 221 may act as an N-layer of a PIN diode employed in embodiments. That is, first conduction type conduction layer 221 may be, but is not limited to, an N-type conduction layer.

First conduction type conduction layer 221 may be formed of n-doped amorphous silicon, but is not limited thereto. That is, first conduction type conduction layer 221 may be formed of a-Si:H, a-SiGe:H, a-SiC, a-SiN:H, a-SiO:H or the like which may be formed by adding Ge, C, N, or the like to amorphous silicon.

First conduction type conduction layer 221 may be formed by a chemical vapor deposition (CVD) and may, for example, be formed by a plasma enhanced CVD (PECVD). For example, the first conduction type conduction layer 221 may be formed of amorphous silicon by a PECVD in which $PH_3$, $P_2H_5$ and the like are mixed with Silane ($SiH_4$) gas.

An intrinsic layer 223 may formed on and/or over the first conduction type conduction layer 221. The intrinsic layer 223 may act as an I-layer of the PIN diode employed in embodiments. Intrinsic layer 223 may be formed of amorphous silicon and may be formed by a CVD such as, for example, a PECVD. For example, intrinsic layer 223 may be formed of amorphous silicon by a PECVD using silane ($SiH_4$) gas.

A second conduction type conduction layer 225 may be formed on the intrinsic layer 223. The second conduction type conduction layer 225 and intrinsic layer 223 may, for example, be formed in-situ. The second conduction type conduction layer 225 may act as a P-layer of the PIN diode employed in embodiments. That is, the second conduction type conduction layer 225 may be, but is not limited to, a P-type conduction layer. The second conduction type conduction layer 225 may be formed by a CVD such as, for example, a PECVD. For example, second conduction type conduction layer 225 may be formed of amorphous silicon by a PECVD in which Boron (B) or the like is mixed with Silane ($SiH_4$) gas.

An upper electrode 240 may be formed on and/or over the second conduction type conduction layer 225. Upper electrode 240 may be formed of a transparent electrode material having a high light transmission and a high conductivity. For example, upper electrode 150 may be formed of indium tin oxide (ITO), cadmium tin oxide (CTO), or the like.

Example FIG. 4 is a graph illustrating effects of an image sensor in accordance with embodiments. That is, example FIG. 4 shows a difference in pinning voltage (Vpin) when N+implantation and contact are formed in a comparative example (Old) and an image sensor in accordance with embodiments (New).

For example, in the case where an image sensor is a 4TrCIS including four transistors, a transfer transistor (Tx) may be formed in an interface of a substrate, a signal is transferred to a drive transistor so as to convert light received by a photodiode (PD) to a signal, and it is essential to form a current path toward a floating diffusion (FD) in a surface of the substrate, which is performed by a high concentration first conduction type ion implantation, for example, N+ implantation (XN imp).

In a related image sensor, because N+ implantation may be performed to a portion under the transfer transistor (Tx), a depletion region may become narrow, which adversely impacts a smooth pinning. The impact on smooth pinning is seen from the experimental results of example FIG. 4. That is, in the comparative example (Old), a pinning voltage of 3.21 V was measured, which is a value close to a sweep value of 3.3 V. The measured pinning voltage shows that the depletion is generated at a region close to an end portion of the transfer transistor (Tx) and a strong electric field may be formed so that a normal Tr operation is unlikely to be performed.

Meanwhile, in accordance with embodiments (New), after an electrical junction region 140 is formed, a first metal contact hole may be formed and N+ region 147 may be spaced apart from the transfer transistor (Tx) by N+ implantation through a plug implant using the contact hole so that a current path may be formed through the electrical junction region 140. As a result, the formation of a strong electric field under the transfer transistor (Tx) is minimized to form a depletion space, thereby inducing a normal operation. In the test results of example FIG. 4, the pinning voltage of an image sensor in accordance with embodiments was 1.748 V, which is a similar value to the pinning voltage of a normal CIS.

Although a normal CIS may have an average pinning voltage of ~1.4 V, to obtain this pinning voltage, impurity ions are implanted such that N+ region is formed at some of a center of electrical junction region 140 using a circular, elliptical, polygonal mask for N+ implantation. By doing so with a process after the M1 contact is formed, a failure which may be generated from a contact size and uniformity as performed after the forming of M1 contact, can be minimized.

The image sensor and the manufacturing method thereof in accordance with embodiments can provide vertical integration of the circuitry and the photodiode and can enhance the image quality since electrons generated in the vertical type photodiode may be transferred through the electrical junction region. Furthermore, in accordance with embodiments, the vertical integration of the circuitry and the photodiode allows a fill factor close to 100%.

In addition, in accordance with embodiments, the vertical integration of the circuitry and the photodiode may provide a sensitivity higher than that in related sensors of about an equal pixel size. Moreover, in accordance with embodiments, manufacturing costs for obtaining a selected resolution can be minimized.

Also, in accordance with embodiments, each unit pixel can implement more complicated circuitry without decreasing the sensitivity. Further, additional on-chip circuitry that can be integrated by embodiments can maximize performance of the image sensor, minimize device sizes, and minimize the manufacturing costs.

Although embodiments relate generally to a complementary metal oxide semiconductor (CMOS) image sensor, such embodiments are not limited to only CMOS images sensor but may include any image sensor requiring a photodiode.

It will be obvious and apparent to those skilled in the art that various modifications and variations can be made in the embodiments disclosed. Thus, it is intended that the disclosed embodiments cover the obvious and apparent the modifications and variations, provided that they are within the scope of the appended claims and their equivalents.

What is claimed is:

1. An image sensor comprising:
   a circuitry including a transistor over a substrate;
   an electrical junction region at one side of the transistor, the electrical junction region comprising a first conduction type ion implantation layer, and a second conduction type ion implantation layer formed on the first conduction type ion implantation layer;
   a high concentration first conduction type region formed in the first conduction type ion implantation layer and the second conduction type ion implantation layer; and
   a photodiode over the circuitry.

2. The image sensor of claim 1, wherein the electrical junction region comprises a PN junction.

3. The image sensor of claim 1, wherein the electrical junction region comprises a PNP junction.

4. The image sensor of claim 1, wherein the high concentration first conduction type region is at least partially formed over the electrical junction region by an implant.

5. The image sensor of claim 1, wherein the photodiode comprises:
   an intrinsic layer electrically connected to the circuitry; and
   a second conduction type conduction layer over the intrinsic layer.

6. The image sensor of claim 2, wherein the photodiode comprises:
   an intrinsic layer electrically connected to the circuitry; and
   a second conduction type conduction layer over the intrinsic layer.

7. The image sensor of claim 1, comprising:
   a metal interconnection formed over the high concentration first conduction type region, and electrically coupled with the electrical junction region and the photodiode.

8. The image sensor of claim 7, comprising:
   an interlayer dielectric layer formed over the electrical junction region and the high concentration first conduction type region, and wherein the metal interconnection extends through the interlayer dielectric layer.

* * * * *